(12) United States Patent
Tamura

(10) Patent No.: US 7,980,861 B2
(45) Date of Patent: Jul. 19, 2011

(54) PRINTED CIRCUIT BOARD UNIT AND SOCKET

(75) Inventor: Akira Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/765,405

(22) Filed: Apr. 22, 2010

(65) Prior Publication Data

US 2010/0200280 A1 Aug. 12, 2010

Related U.S. Application Data

(63) Continuation of application No. PCT/JP2007/070712, filed on Oct. 24, 2007.

(51) Int. Cl.
*H01R 12/00* (2006.01)
(52) U.S. Cl. .......................... 439/66; 439/247
(58) Field of Classification Search .............. 439/66, 439/247, 248
See application file for complete search history.

(56) References Cited

U.S. PATENT DOCUMENTS

| | | | |
|---|---|---|---|
| 5,135,414 A | 8/1992 | van Dijk | |
| 6,326,688 B1 | 12/2001 | Ochiai | |
| 7,404,717 B2 * | 7/2008 | Kazama | 439/66 |
| 2005/0170675 A1 * | 8/2005 | Takada | 439/66 |
| 2006/0040519 A1 | 2/2006 | Arai et al. | |
| 2006/0228914 A1 | 10/2006 | Oda | |

FOREIGN PATENT DOCUMENTS

| | | |
|---|---|---|
| JP | 59-68187 | 4/1984 |
| JP | 8-162238 | 6/1996 |
| JP | 8-250242 | 9/1996 |
| JP | 2909570 | 4/1999 |
| JP | 2000-156269 | 6/2000 |
| JP | 2006-294308 | 10/2006 |
| TW | I273745 | 2/2007 |

OTHER PUBLICATIONS

English language International Search Report for PCT/JP2007/070712, mailed on Feb. 5, 2008.
Office Action for Taiwanese Application No. 096139835, mailed Oct. 26, 2010.

* cited by examiner

*Primary Examiner* — Gary F. Paumen
(74) *Attorney, Agent, or Firm* — Staas & Halsey LLP

(57) ABSTRACT

A second electrically-conductive terminal, having flexibility, contact with a first electrically-conductive terminal. A second substrate has first and second surfaces. The second surface supports the second electrically-conductive terminal. A third electrically-conductive terminal, having flexibility, is located on the first surface of the second substrate. The third electrically-conductive terminal is connected to the second electrically-conductive terminal. A fourth electrically-conductive terminal contacts with the third electrically-conductive terminal. A third substrate has a surface supporting the fourth electrically-conductive terminal. A frame is interposed between the first substrate and the third substrate. The frame supports the outer periphery of the second substrate. The frame allows relative movement of the second substrate in the direction perpendicular to the first surface of the second substrate.

6 Claims, 8 Drawing Sheets

PRINTED CIRCUIT BOARD UNIT AND SOCKET

CROSS-REFERENCE TO RELATED APPLICATION

This application is a continuing application, filed under 35 U.S.C. §111(a), of International Application PCT/JP2007/070712, filed on Oct. 24, 2007, the contents of which are incorporated herein by reference.

FIELD

The present invention relates to a socket interposed between a printed wiring board and a large-scale integrated circuit (LSI) chip package, for example.

BACKGROUND

A so-called land grid array (LGA) socket is well known. The LGA socket is utilized to mount a LSI chip package on a printed wiring board, for example. The LGA socket includes back-side electrically-conductive terminals arranged on the back surface of a socket substrate. The back-side electrically-conductive terminals are received on electrically-conductive pads on a printed wiring board when the LGA socket is received on the printed wiring board. The LGA socket further includes front-side electrically-conductive terminals arranged on the front surface of the socket substrate. Each of the front-side electrically-conductive terminals are connected to a corresponding one of the back-side electrically-conductive terminals. The front-side electrically-conductive terminals respectively receive the corresponding electrically-conductive terminals of the LSI chip package. In this manner, the LGA socket serves to establish electrical connection between the socket substrate, representative of an electronic component package substrate, and a printed wiring board.

Publication 1: Japanese Patent Application Laid-open No. 59-068187
Publication 2: Japanese Patent No. 2909570
Publication 3: Japanese Patent Application Laid-open No. 8-250242

The socket substrate includes a flange standing upright in the direction normal to the surface of the socket substrate at the outer periphery. The flange is interposed between the printed wiring board and the electronic component package substrate. The socket substrate is equally spaced from the front surface of the printed wiring board and the back surface of the electronic component package substrate. The electrically-conductive pads protrude from the front surface of the printed wiring board by a predetermined height. The electrically-conductive terminals of the LSI chip package sink into the back surface of the LSI chip package. As a result, the back-side electrically-conductive terminals are forced to largely deform as compared with the front-side electrically-conductive terminals. The front-side electrically-conductive terminals enjoy a reduced amount of deformation. A contact pressure is reduced between the front-side electrically-conductive terminals and the electrically-conductive terminals of the LSI chip package. Consequently, a failure in electrical connection is sometimes caused between the front-side electrically-conductive terminals and the electrically-conductive terminals of the LSI chip package.

SUMMARY

According to a first aspect of the invention, a printed circuit board unit includes: a first substrate; a first electrically-conductive terminals located on a surface of the first substrate; a second electrically-conductive terminal contacting with the first electrically-conductive terminal, the second electrically-conductive terminal having flexibility; a second substrate having a first surface and a second surface opposite the first surface, the second surface supporting the second electrically-conductive terminal; a third electrically-conductive terminal located on the first surface of the second substrate, the third electrically-conductive terminal having flexibility, the third electrically-conductive terminal connected to the second electrically-conductive terminal; a fourth electrically-conductive terminal contacting with the third electrically-conductive terminal; a third substrate having a surface supporting the fourth electrically-conductive terminal; and a frame interposed between the first substrate and the third substrate, the frame supporting the outer periphery of the second substrate, the frame allowing relative movement of the second substrate in the direction perpendicular to the first surface of the second substrate.

According to a second aspect of the present invention, a socket includes: a substrate having a first surface and a second surface opposite the first surface; a first electrically-conductive terminal located on the first surface of the substrate, the first electrically-conductive terminal having flexibility; a second electrically-conductive terminal located on the second surface of the substrate, the second electrically-conductive terminal having flexibility, the second electrically-conductive terminal connected to the first electrically-conductive terminal; and a frame supporting an outer periphery of the substrate, the frame allowing relative movement of the substrate in the direction perpendicular to the first surface of the substrate.

The object and advantages of the embodiments will be realized and attained by means of the elements and combinations particularly pointed out in the appended claims. It is to be understood that both the foregoing general description and the following detailed description are exemplary and explanatory and are not restrictive of the embodiments, as claimed.

DESCRIPTION OF EMBODIMENTS

Description will be made below on embodiments of the present invention with reference to the attached drawings.

Figure 1:
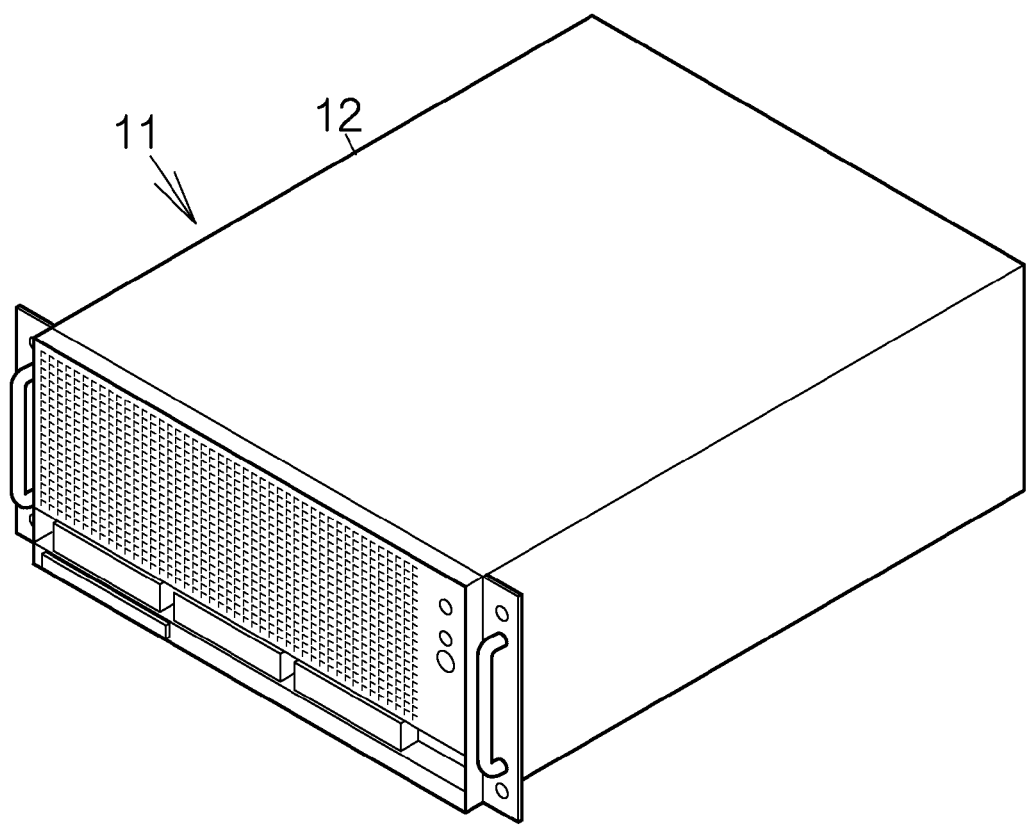
FIG. 1 is a perspective view schematically illustrating an electronic apparatus, namely a server computer apparatus, according to a specific example of the present invention.

FIG. 1 schematically depicts a server computer apparatus 11 as an example of an electronic apparatus according to an embodiment. The server computer apparatus 11 includes a box-shaped enclosure 12. The box-shaped enclosure 12 defines an inner space, for example. A printed circuit board unit, namely a motherboard, is placed in the inner space of the box-shaped enclosure 12. A large-scale integrated circuit (LSI) chip package, a main memory, and the like, are mounted on the motherboard. The LSI chip package will be described later in detail. The LSI chip package is configured to execute various kinds of processing based on a software program and data temporarily held in the main memory, for example. The software program and the data may be stored in a large capacity storage, such as a hard disk drive, HDD, likewise placed in the inner space of the box-shaped enclosure 12. The server computer apparatus 11 is mounted on a rack, for example.

Figure 2:
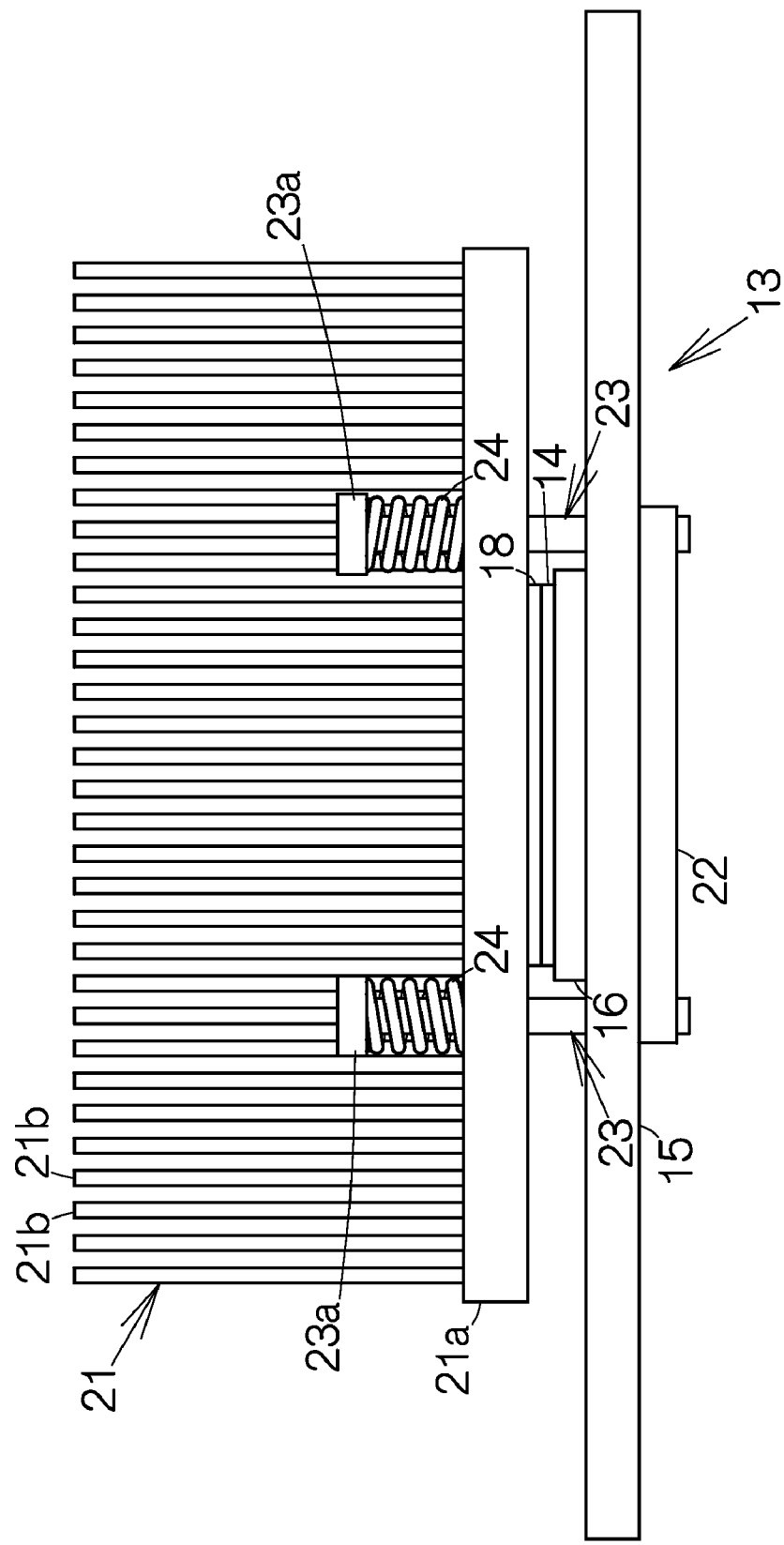
FIG. 2 is a side view schematically illustrating a motherboard according to an embodiment of the present invention.

As depicted in FIG. 2, a so-called land grid array (LGA) socket 16 is interposed between an LSI chip package 17 and a printed wiring board 15 in a motherboard 13 according to an embodiment. A resin substrate is employed as the printed wiring board 15. The LSI chip package 17 is received on the LGA socket 16. The LGA socket 16 and the LSI chip package 17 will be described later in detail. A heat conductive member, namely a heat spreader 18, is received on the LSI chip package 17. The heat spreader 18 is made of a metallic material such as copper, for example.

A heat radiating member, namely a heat sink 21, is received on the heat spreader 18. The heat sink 21 includes a base plate 21a extending in parallel with the upward surface of the heat spreader 18. Fins 21b stand upright from the base plate 21a in the direction perpendicular to the surface of the base plate 21a. The fins 21 extend in parallel with one another. Airflow passages are defined between adjacent ones of the fins 21b. The LSI chip package 17 is interposed between the printed wiring board 15 and the heat sink 21. The heat sink 21 may be made of a metallic material such as copper or aluminum. Casting process may be employed to form the heat sink 21, for example.

A bolster plate 22 is coupled to the heat sink 21. The bolster plate 22 is overlaid on the back surface of the printed wiring board 15. Bolts 23, four of them, for example, are utilized to couple the heat sink 21 and the bolster plate 22 to each other. The bolts 23 has the central axis kept in the attitude perpendicular to the front surface of the printed wiring board 15. The individual bolt 23 penetrates through the base plate 21a and the printed wiring board 15. The bolts 23 are located outside the corners of the LSI chip package 17, respectively. The bolts 23 may be located on the extension lines of the diagonal lines of the LSI chip package 17.

An elastic member 24 is interposed between a bolt head 23a of the individual bolt 23 and the base plate 21a. The elastic member 24 may be a helical spring exhibiting a resilient force to distance the bolt head 23a and the base plate 21a away from each other, for example. In this manner, the heat sink 21, specifically the base plate 21a, is urged toward the printed wiring board 15.

Figure 3:
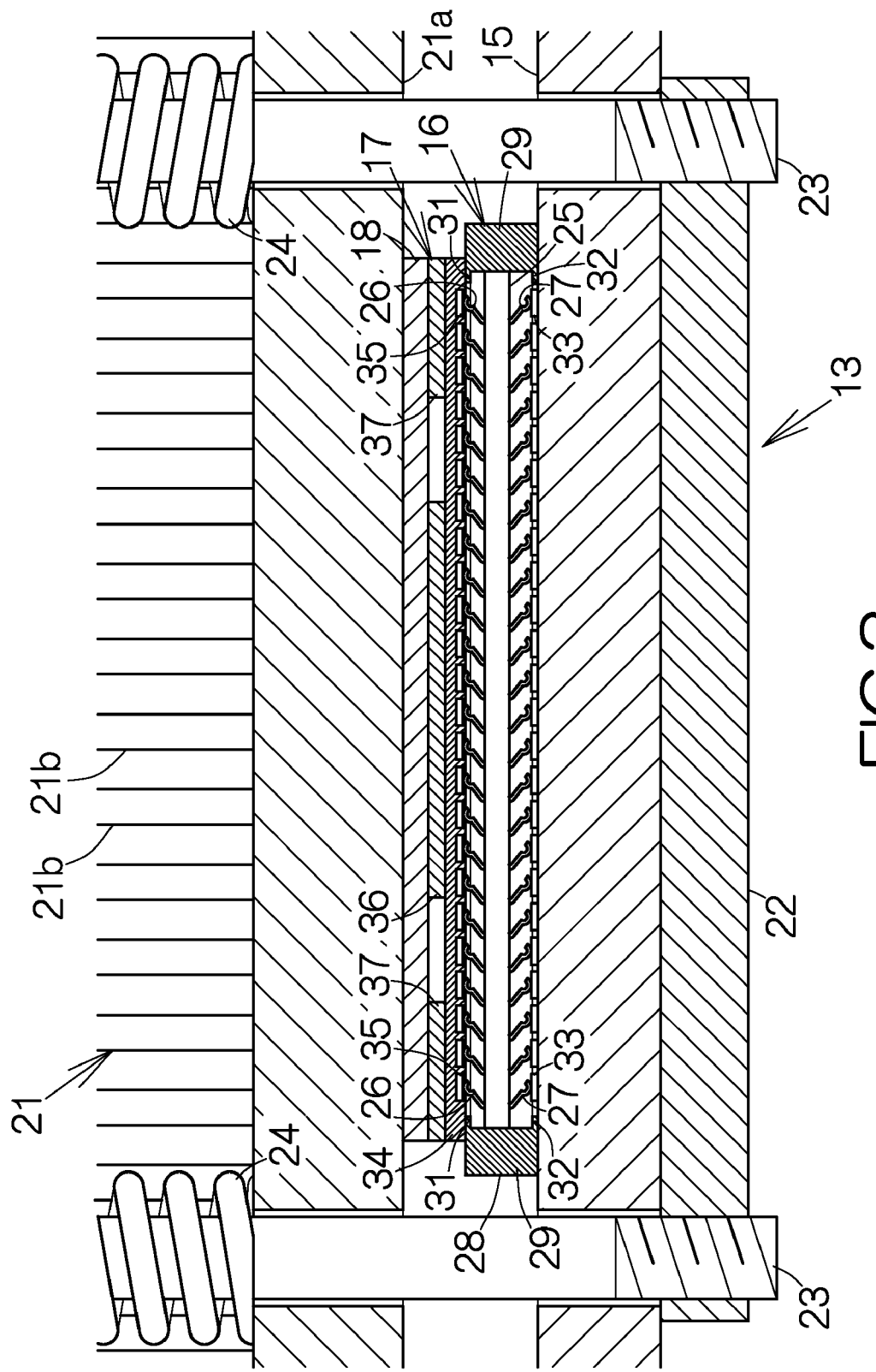
FIG. 3 is a sectional view schematically illustrating the motherboard.

As depicted in FIG. 3, the LGA socket 16 includes a rectangular socket substrate 25, for example. The socket substrate 25 may be a resin substrate having flexibility, for example. Electrically-conductive terminals 26 are located on the front surface of the socket substrate 25. The LSI chip package 17 is received on the electrically-conductive terminals 26. Likewise, electrically-conductive terminals 27 are located on the back surface of the socket substrate 25. The socket substrate 25 is received on the printed wiring board 15 through the electrically-conductive terminals 27. The electrically-conductive terminals 26, 27 are made of elastic metallic pieces having flexibility. The electrically-conductive terminals 26 extend upward from the front surface of the socket substrate 25 in a predetermined attitude inclined from the direction perpendicular to the front surface of the socket substrate 25. The electrically-conductive terminals 27 likewise extend downward from the back surface of the socket substrate 25 in a predetermined attitude inclined from the direction perpendicular to the back surface of the socket substrate 25. The elasticity of the electrically-conductive terminals 26, 27 serves to distance the tip ends of the electrically-conductive terminals 26, 27 away from the front and back surfaces of the socket substrate 25, respectively. In this manner, the electrically-conductive terminals 26, 27 reliably contact with the LSI chip package 17 and the printed wiring board 15, respectively. The socket substrate 25 may be an insulating metallic substrate.

The LGA socket 16 includes a frame 28 endlessly extending along the outer periphery of the socket substrate 25 to surround the socket substrate 25. The frame 28 includes the upper and lower end surfaces extending within parallel imaginary planes, respectively. The LSI chip package 17 is received on the upper end surface of the frame 28. The lower end surface of the frame 28 is received on the printed wiring board 15. As described above, an urging force is applied to the base plate 21a of the heat sink 21 toward the printed wiring board 15. The urging force is transferred to the LSI chip package 17 from the base plate 21a. The LGA socket 16 is thus urged against the front surface of the printed wiring board 15.

The frame 28 defines a peripheral wall 29 contacting the outer periphery of the socket substrate 25. A first projecting wall 31 projects inward from the upper end of the peripheral wall 29 in parallel with the aforementioned parallel imaginary planes. A second projecting wall 32 likewise projects inward from the lower end of the peripheral wall 29 in parallel with the aforementioned parallel imaginary planes. The peripheral wall 29, the first projecting wall 31 and the second projecting wall 32 in combination define a space in the form of a rectangular parallelepiped. The socket substrate 25 is placed in this space. The socket substrate 25 is in this manner placed in a space between the first projecting wall 31 and the second projecting wall 32. A predetermined gap is defined between the front surface of the socket substrate 25 and the first projecting wall 31 as well as between the back surface of the socket substrate 25 and the second projecting wall 32. In this manner, the socket substrate 25 is supported on the frame 28 for relative movement in the direction of the thickness of the socket substrate 25, that is, in the direction perpendicular to the front surface of the printed wiring board 15 or the aforementioned parallel imaginary planes.

Electrically-conductive terminals 33 are located on the front surface of the printed wiring board 15. The electrically-conductive terminals 27 of the LGA socket 16 are received on the electrically-conductive terminals 33. Each of the electrically-conductive terminals 27 of the LGA socket 16 is assigned to a corresponding one of the electrically-conductive terminals 33 on the printed wiring board 15 one by one. The LSI chip package 17 includes a package substrate 34. A glass ceramic substrate is employed as the package substrate 34, for example. Electrically-conductive terminals 35 are located on the back surface of the package substrate 34. The electrically-conductive terminals 35 are received on the electrically-conductive terminals 26 of the LGA socket 16. Each of the electrically-conductive terminals 35 of the package substrate 34 is assigned to a corresponding one of the electrically-conductive terminals 26 of the LGA socket 16 one by one.

An LSI chip 36 is mounted on the front surface of the package substrate 34. A reinforcing member, namely a stiffener 37, is received on the front surface of the package substrate 34 so as to surround the LSI chip 36. The stiffener 37 is made of a metallic material such as copper. The aforementioned heat spreader 18 is received on the stiffener 37. The heat spreader 18 is also received on the surface of the LSI chip 36. A thermal conductive material such as thermal conductive paste or the like may be interposed between the LSI chip 36 and the heat spreader 18. The heat conductive material serves to increase the contact area between the LSI chip 36 and the heat spreader 18.

Figure 4:
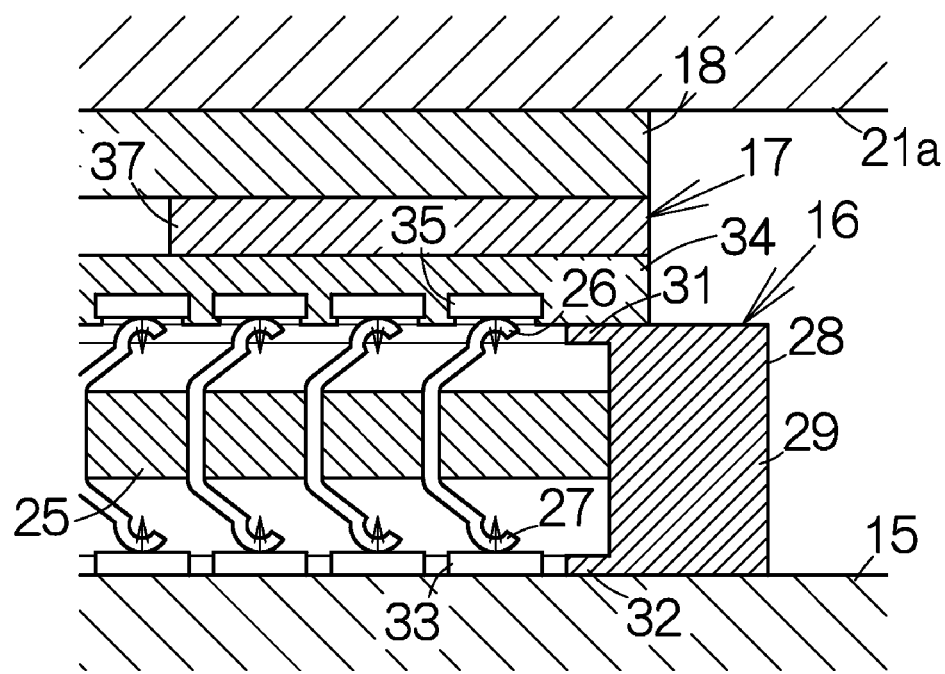
FIG. 4 is an enlarged partial sectional view of the motherboard.

As depicted in FIG. 4, each of the electrically-conductive terminals 26 on the front surface is connected to a corresponding one of the electrically-conductive terminals 27 on the back surface in the LGA socket 16. Here, the individual electrically-conductive terminal 26 and the corresponding electrically-conductive terminal 27 are formed in one elastic metallic piece. The elastic metallic piece formed in a plate-like shape. Each of the electrically-conductive terminals 26 is in this manner assigned to a corresponding one of the electrically-conductive terminals 27 one by one. The individual elastic metallic piece is held in a through hole penetrating through the socket substrate 25 from the front surface to the back surface of the socket substrate 25. As described above, the electrically-conductive terminals 26 extend upward from the front surface of the socket substrate 25 in an attitude inclined from the direction perpendicular to the front surface of the socket substrate 25, while the electrically-conductive terminals 27 extend downward from the back surface of the socket substrate 25 in an attitude inclined from the direction perpendicular to the back surface of the socket substrate 25. The elasticity of the electrically-conductive terminals 26, 27 enables a reliable contact of the electrically-conductive terminals 26, 27 with the electrically-conductive terminals 35, 33, respectively.

As is apparent from FIG. 4, the electrically-conductive terminals 33 are located on the front surface of the printed wiring board 15. The electrically-conductive terminals 33 swell from the front surface of the printed wiring board 15 by a predetermined height. The electrically-conductive terminals 35 are embedded in the package substrate 34. The electrically-conductive terminals 35 are thus located at the bottoms of the depressions defined on the back surface of the package substrate 34. The electrically-conductive terminals 35 in this manner sink into the package substrate 34 from the back surface of the package substrate 34 by a predetermined depth.

Figure 5:
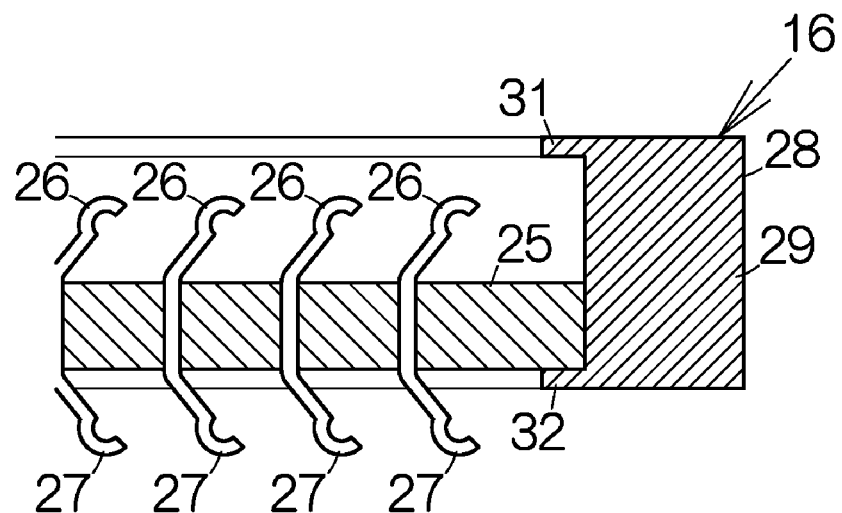
FIG. 5 is an enlarged partial sectional view of a land grid array (LGA) socket.
Figure 6:
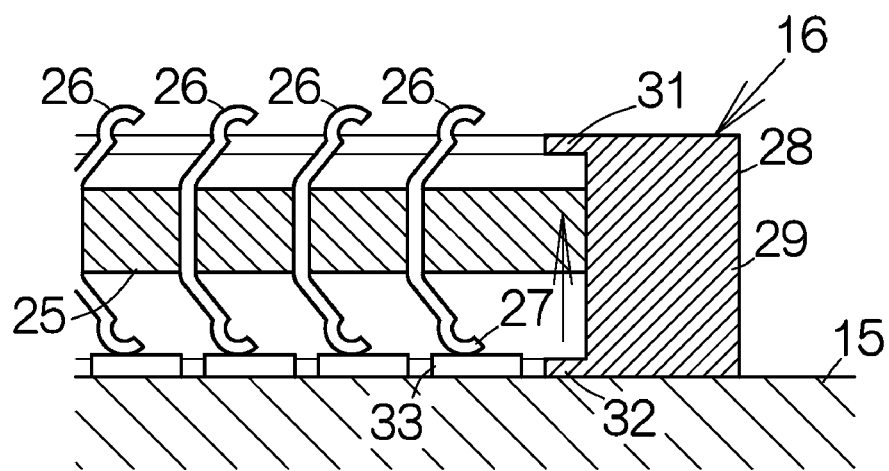
FIG. 6 is an enlarged partial sectional view schematically illustrating the situation where the LGA socket is placed on a printed wiring board.

Description will be made on a method of making the motherboard 13. The LGA socket 16 is first prepared as depicted in FIG. 5. Since a resilient force is not cumulated in the electrically-conductive terminals 26, 27 in the original shape, the socket substrate 25 is received on the second projecting wall 32 of the frame 28. As depicted in FIG. 6, the frame 28 of the LGA socket 16 is received on the front surface of the printed wiring board 15. The electrically-conductive terminals 27 are placed on the corresponding electrically-conductive terminals 33. The socket substrate 25 is thus lifted in the direction perpendicular to the front surface of the printed wiring board 15. The weight of the socket substrate 25 serves to cumulate a predetermined resilient force in the electrically-conductive terminals 27.

Figure 7:
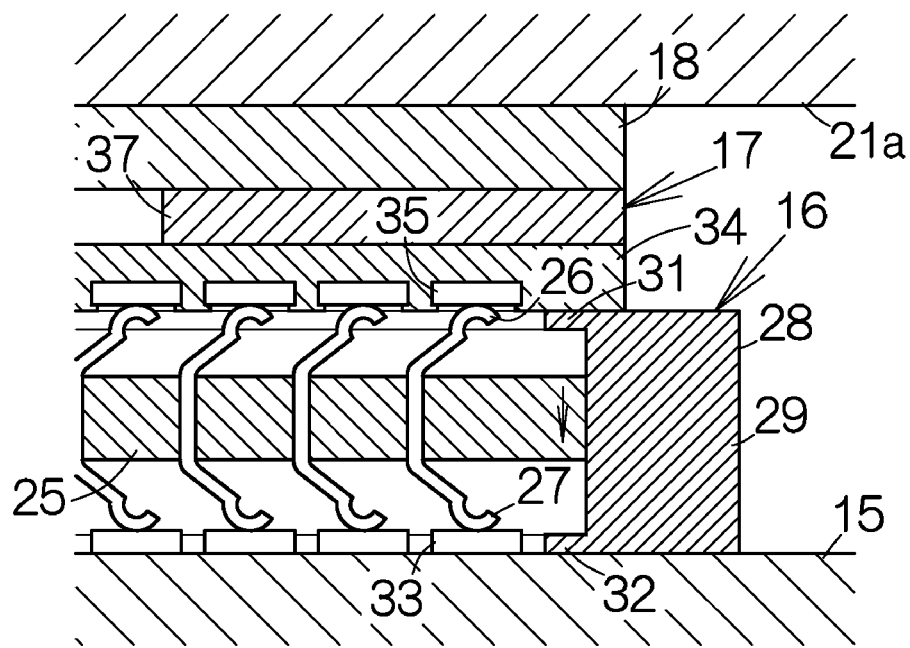
FIG. 7 is an enlarged partial sectional view schematically illustrating the situation where an LSI chip package, a heat spreader and a heat sink are placed on the printed wiring board.

The LSI chip package 17, the heat spreader 18 and the heat sink 21 are placed on the LGA socket 16 in this sequence. As depicted in FIG. 7, the base plate 21a of the heat sink 21 applies the urging force to the package substrate 34 so that the package substrate 34 is received on the upper end of the frame 28. The electrically-conductive terminals 26 receive the electrically-conductive terminals 35 of the package substrate 34. In this manner, a resilient force is cumulated in the electrically-conductive terminals 26, 27 to distance the tip ends of the electrically-conductive terminals 26, 27 away from the socket substrate 25, respectively. The elasticity of the electrically-conductive terminals 26 is balanced with the elasticity of the electrically-conductive terminals 27 to position the socket substrate 25 between the electrically-conductive terminals 33, 35. The distance from the electrically-conductive terminals 33 to the socket substrate 25 is equalized with the distance from the electrically-conductive terminals 35 to the socket substrate 25. In this manner, the motherboard 13 is assembled. It should be noted that the order of the processes of making the motherboard 13 is not limited to the one described above.

The socket substrate 25 of the LGA socket 16 is supported on the frame 28 for relative movement in the direction perpendicular to the front surface of the socket substrate 25 in the motherboard 13. The relative movement of the socket substrate 25 enables equalization of the elasticity acting on the socket substrate 25 from the electrically-conductive terminals 26 with the elasticity acting on the socket substrate 25 from the electrically-conductive terminals 27. Since the electrically-conductive terminals 26, 27 have the equal property, the electrically-conductive terminals 26 and the electrically-conductive terminals 27 deform by the same amount of deformation. As a result, the distance from the electrically-conductive terminals 33 to the socket substrate 25 is equalized with the distance from the electrically-conductive terminals 35 to the socket substrate 25. All the electrically-conductive terminals 26 on the front surface reliably contact with the electrically-conductive terminals 35, respectively. All the electrically-conductive terminals 27 on the back surface likewise reliably contact with the electrically-conductive terminals 33, respectively. Each of the electrically-conductive terminals 26, 27 reliably achieve electric connection. A failure is reliably prevented in electrical conduction.

Moreover, the socket substrate 25 is a resin substrate having flexibility. Even in the case where the heights of the electrically-conductive terminals 26 or the electrically-conductive terminals 27 are uneven due to a fabrication error, for example, the socket substrate 25 is allowed to deform. The tip ends of the electrically-conductive terminals 26 and the tip ends of the electrically-conductive terminals 27 exhibit a contact pressure as uniformly as possible. All the electrically-conductive terminals 26 on the front surface reliably contact with the electrically-conductive terminals 35, respectively, as described above. All the electrically-conductive terminals 27 on the back surface likewise reliably contact with the electrically-conductive terminals 33, respectively. Each of the electrically-conductive terminals 26, 27 reliably achieve electric connection. A failure is reliably prevented in electrical conduction.

On the other hand, if a socket substrate is rigidly fixed to a frame, for example, the position of the socket substrate is fixed, in other word, in general equally spaced from the front surface of a printed wiring board and the back surface of a package substrate. If electrically-conductive terminals protrude from the front surface of the printed wiring board by a predetermined height and electrically-conductive terminals are embedded in the package substrate, as described above, the electrically-conductive terminals on the back surface of the socket substrate are forced to largely deform as compared with the electrically-conductive terminals on the front surface of the socket substrate. The electrically-conductive terminals on the front surface solely enjoy a smaller amount of deformation. The contact pressure is reduced between the electrically-conductive terminals on the front surface and the electrically-conductive terminals of the package substrate. A failure tends to occur in electrical conduction between the electrically-conductive terminals on the front surface and the electrically-conductive terminals of the package substrate.

Figure 8:
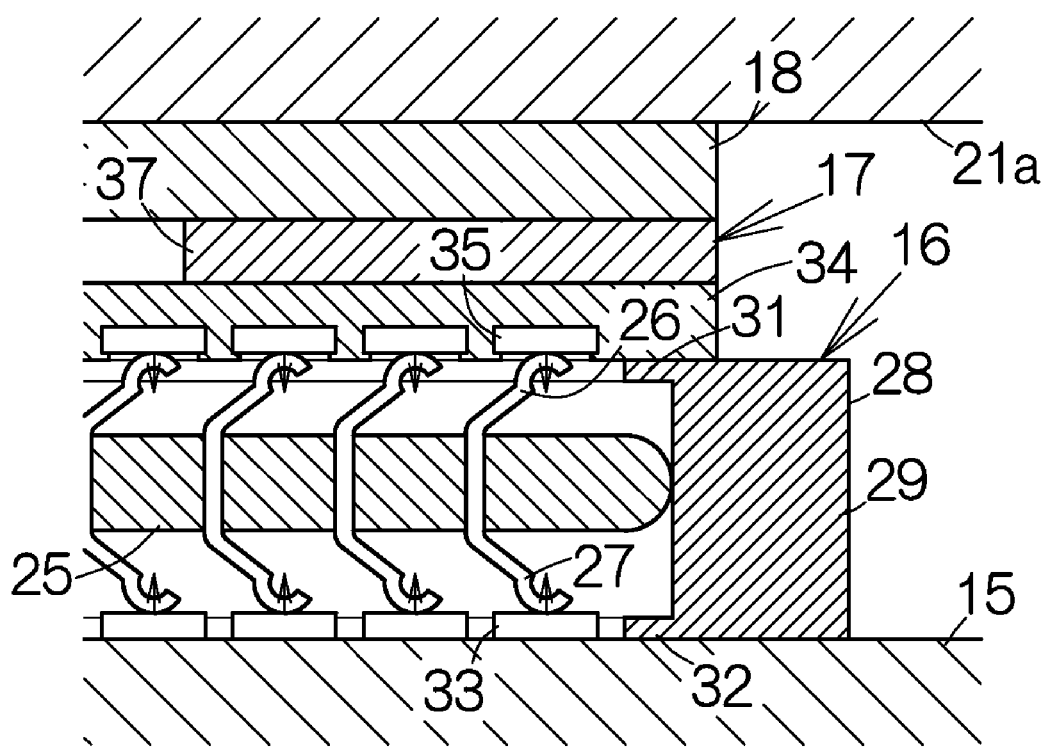
FIG. 8 is an enlarged partial sectional view schematically illustrating a motherboard according to a modification of the present invention.

As depicted in FIG. 8, the outer periphery of the socket substrate 25 may be rounded to define a curved surface establishing a linear contact with the peripheral wall 29 of the frame 28. The curved surface of the socket substrate 25 is brought in contact with the peripheral wall 29. Like reference numerals are attached to the structure or components equivalent to the aforementioned ones. The LGA socket 16 realizes a smaller contact area between the outer periphery of the socket substrate 25 and the peripheral wall 29 of the frame 28 as compared with the case where the outer periphery of the socket substrate 25 is squared to define a flattened end surface establishing a surface contact with the peripheral wall 29 of the frame 28. Friction is reduced between the outer periphery of the socket substrate 25 and the peripheral wall 29 of the frame 28. Consequently, the socket substrate 25 is allowed to smoothly move in the direction perpendicular to the front surface of the socket substrate 25. The tip ends of the electrically-conductive terminals 26 and the tip ends of the electrically-conductive terminals 27 reliably exhibit a contact pressure as uniformly as possible.

Figure 9:
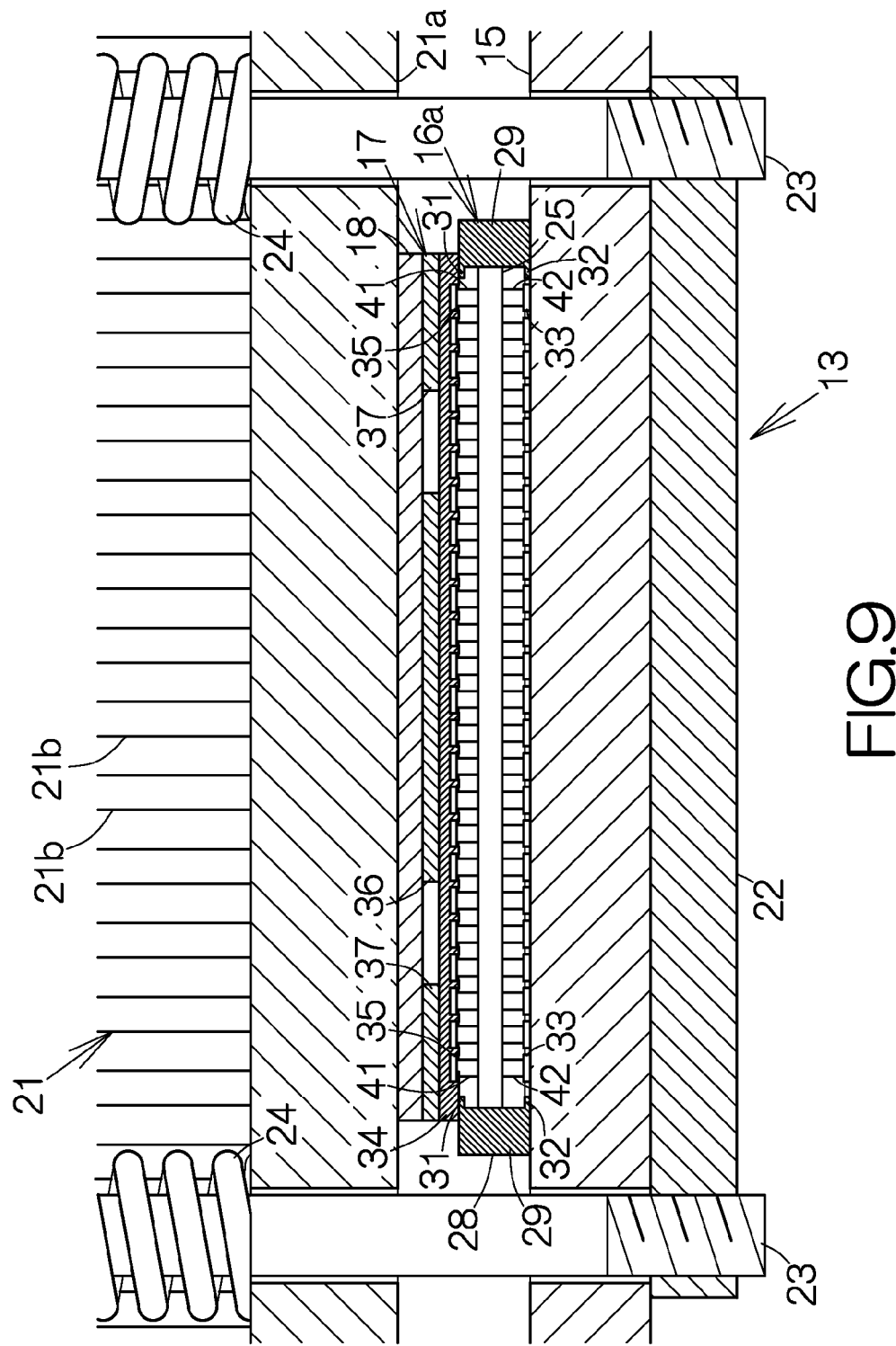
FIG. 9 is a sectional view schematically illustrating a motherboard according to another embodiment of the present invention.
Figure 10:
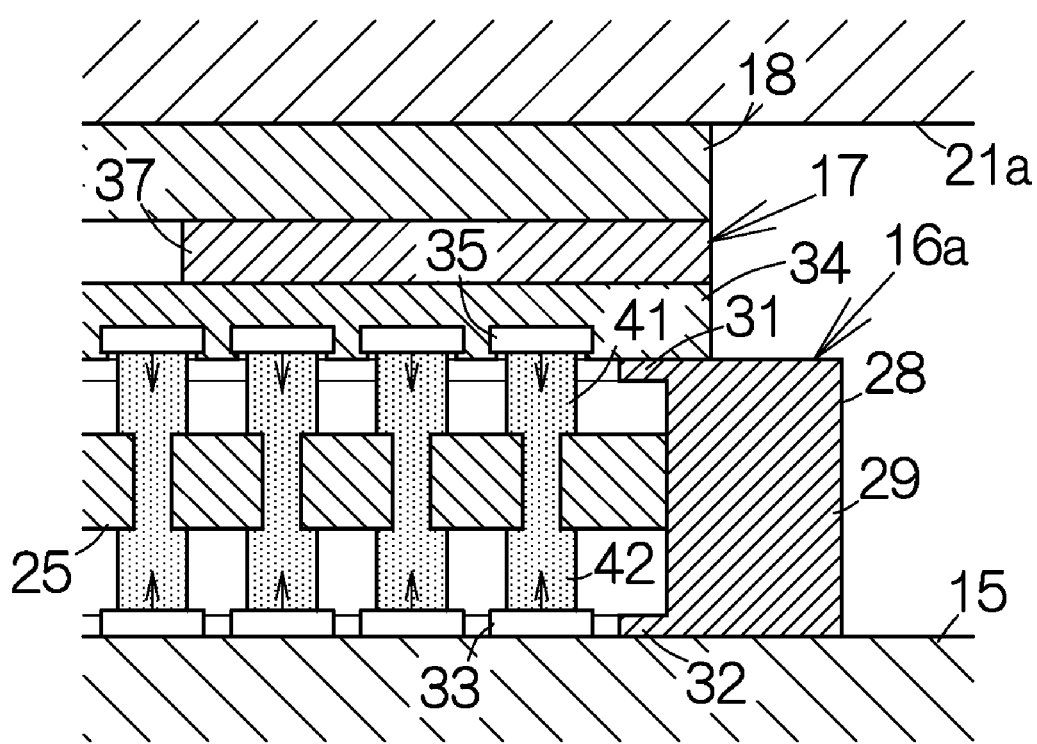
FIG. 10 is an enlarged partial sectional view of the motherboard.

As depicted in FIG. 9, an LGA socket 16a may be incorporated in the motherboard 13 in place of the aforementioned LGA socket 16. Electrically-conductive terminals 41 are located on the front surface of the socket substrate 25 in the LGA socket 16a. Electrically-conductive terminals 42 are located on the back surface of the socket substrate 25. The electrically-conductive terminals 41 and the electrically-conductive terminals 42 are connected to each other in the same manner as described above. Each of the electrically-conductive terminals 41 is assigned to a corresponding one of the electrically-conductive terminals 42 one by one. As depicted in FIG. 10, through holes are formed in the socket substrate 25 for the connection of the electrically-conductive terminals 41, 42. The through holes penetrate from the front surface to the back surface of the socket substrate 25. The individual through hole serves to establish a integrated piece of the electrically-conductive terminal 41 and the corresponding electrically-conductive terminal 42.

The electrically-conductive terminals 41, 42 are made of an elastic material, such as electrically-conductive resin or rubber containing electrically-conductive material. The electrically-conductive terminals 41, 42 thus have flexibility. The rubber may contain electrically-conductive material such as metallic particles dispersed in the rubber. The content of the metallic particles in the rubber may be set equal to or larger than 90% by volume, for example. Specifically, the rubber functions as a so-called binder. The individual metallic particle may have a diameter of him approximately, for example. The metallic particles enable electrical connection from the electrically-conductive terminals 35 of the LSI chip package 17 to the electrically-conductive terminals 33 of the printed wiring board 15. Like reference numerals are attached to the structure or components equivalent to the aforementioned ones.

The socket substrate 25 is supported on the frame 28 for relative movement in the direction perpendicular to the front surface of the socket substrate 25 in the LGA socket 16a in the same manner as described above. The relative movement of the socket substrate 25 enables equalization of the elasticity acting on the socket substrate 25 from the electrically-conductive terminals 41 with the elasticity acting on the socket substrate 25 from the electrically-conductive terminals 42. Since the electrically-conductive terminals 41, 42 have the equal property, the electrically-conductive terminals 41 and the electrically-conductive terminals 42 deform by the same amount of deformation. As a result, the distance from the electrically-conductive terminals 33 to the socket substrate 25 is equalized with the distance from the electrically-conductive terminals 35 to the socket substrate 25. All the electrically-conductive terminals 41 on the front surface reliably contact with the electrically-conductive terminals 35, respectively. All the electrically-conductive terminals 42 on the back surface likewise reliably contact with the electrically-conductive terminals 33, respectively. Each of the electrically-conductive terminals 41, 42 reliably achieve electric connection. A failure is reliably prevented in electrical conduction.

It should be noted that a printed wiring board may be employed as the socket substrate 25 in the LGA socket 16a, for example. In this case, the electrically-conductive terminals 41 and the electrically-conductive terminals 42 may be connected to each other through wiring extending in the socket substrate 25. Elastic material having electrical conductivity, such as a so-called carbon nanotube, may be utilized to form the electrically-conductive terminals 41, 42.

All examples and conditional language recited herein are intended for pedagogical purposes to aid the reader in understanding the invention and the concept contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A printed circuit board unit comprising:
   a first substrate;
   a first electrically-conductive terminal located on a front surface of the first substrate;
   a second electrically-conductive terminal contacting with the first electrically-conductive terminal, the second electrically-conductive terminal having flexibility;
   a second substrate having a back surface supporting the second electrically-conductive terminal;
   a third electrically-conductive terminal located on a front surface of the second substrate, the third electrically-conductive terminal having flexibility, the third electrically-conductive terminal connected to the second electrically-conductive terminal;
   a fourth electrically-conductive terminal contacting with the third electrically-conductive terminal;
   a third substrate having a back surface supporting the fourth electrically-conductive terminal; and
   a frame interposed between the first substrate and the third substrate so as to define a space for relative movement of the second substrate in a direction perpendicular to the front surface of the second substrate, the frame having a guiding surface surrounding an outer periphery of the second substrate to allow the relative movement of the second substrate.

2. The printed circuit board unit according to claim 1, wherein the frame comprises:
- a peripheral wall contacting the outer periphery of the second substrate;
- a first projecting wall projecting inward from the peripheral wall, the first projecting wall having a surface opposed to the front surface of the second substrate; and
- a second projecting wall projecting inward from the peripheral wall, the second projecting wall having a surface opposed to the back surface of the second substrate.

3. The printed circuit board unit according to claim 1, wherein the second electrically-conductive terminal and the third electrically-conductive terminal are made of an elastic metallic piece having electrical conductivity.

4. The printed circuit board unit according to claim 1, wherein the second electrically-conductive terminal and the third electrically-conductive terminal are made of an elastic material having electrical conductivity.

5. An electronic apparatus comprising the printed circuit board unit according to claim 1.

6. The printed circuit board unit according to claim 1, wherein the second substrate continues to move until the third substrate is in contact with the frame.

* * * * *